United States Patent
Peeters et al.

(10) Patent No.: US 11,715,506 B2
(45) Date of Patent: Aug. 1, 2023

(54) MONOTONIC COUNTER

(71) Applicant: PROTON WORLD INTERNATIONAL N.V., Diegem (BE)

(72) Inventors: Michael Peeters, Tourinnes-la-Grosse (BE); Jean-Louis Modave, Ottignies (BE); Ronny Van Keer, Hoeilaart (BE)

(73) Assignee: PROTON WORLD INTERNATIONAL N.V., Diegem (BE)

( * ) Notice: Subject to any disclaimer, the term of this patent is extended or adjusted under 35 U.S.C. 154(b) by 0 days.

(21) Appl. No.: 17/691,870

(22) Filed: Mar. 10, 2022

(65) Prior Publication Data
US 2022/0293150 A1 Sep. 15, 2022

(30) Foreign Application Priority Data
Mar. 15, 2021 (FR) ...................................... 2102531

(51) Int. Cl.
*G11C 8/04* (2006.01)
*G11C 7/20* (2006.01)

(52) U.S. Cl.
CPC ..... *G11C 8/04* (2013.01); *G11C 7/20* (2013.01)

(58) Field of Classification Search
CPC .................................... G11C 8/04; G11C 7/20
See application file for complete search history.

(56) References Cited

U.S. PATENT DOCUMENTS

| | | |
|---|---|---|
| 3,767,902 A | 10/1973 | Estes, III et al. |
| 4,160,154 A | 7/1979 | Jennings |
| 5,109,395 A | 4/1992 | Tanaka |
| 5,450,460 A * | 9/1995 | Stodieck .............. H03K 21/403 377/44 |
| 6,496,437 B2 | 12/2002 | Leung |
| 6,687,325 B1 * | 2/2004 | Wells .................... H03K 21/403 377/28 |
| 6,961,402 B1 * | 11/2005 | Younis ................. H03K 23/588 377/117 |

(Continued)

FOREIGN PATENT DOCUMENTS

WO 85/04297 9/1985

OTHER PUBLICATIONS

French Search Report and Written Opinion dated Dec. 20, 2011 from French Application No. 11/57006.

*Primary Examiner* — Tuan T Nguyen
(74) *Attorney, Agent, or Firm* — Seed Intellectual Property Law Group LLP

(57) ABSTRACT

A monotonic counter stores N binary words representing a value in N memory cells. When i memory cells of consecutive ranks between k modulo N and k+i modulo N each represent a value complementary to a null value, the counter is incremented by erasing a value of a memory cell of rank k+i+1 modulo N. When i+1 memory cells of consecutive ranks between k+1 modulo N and k+i+1 modulo N each represent the value complementary to the null value, the counter is incremented by incrementing a value of a memory cell of rank k modulo N by two step sizes and storing a result in a memory cell of rank k+1 modulo N, wherein, N is an integer greater than or equal to five, k is an integer, and i is an integer between 2 and N−3.

25 Claims, 8 Drawing Sheets

(56) References Cited

U.S. PATENT DOCUMENTS

| | | | |
|---|---|---|---|
| 7,551,706 B2* | 6/2009 | Takagi | H03K 21/403 |
| | | | 377/33 |
| 8,660,233 B2* | 2/2014 | Dawirs | G11C 16/349 |
| | | | 377/33 |
| 9,008,260 B2 | 4/2015 | Dawirs et al. | |
| 9,454,471 B2 | 9/2016 | Feldhofer et al. | |
| 2002/0075989 A1 | 6/2002 | Joo | |
| 2004/0141580 A1 | 7/2004 | Maletsky | |
| 2007/0147168 A1 | 6/2007 | Pinto et al. | |
| 2018/0309453 A1 | 10/2018 | Lim et al. | |
| 2022/0293150 A1* | 9/2022 | Peeters | G11C 8/04 |

* cited by examiner

MONOTONIC COUNTER

BACKGROUND

Technical Field

The present disclosure relates generally to electronic systems and devices implementing a counter. More particularly, the present description relates to the implementation of a monotonic counter.

Description of the Related Art

A counter is a hardware and/or software entity, able to count countable elements and/or measure quantities. A counter successively performs operations of adding a step to the value it shows.

A counter may be implemented by various electronic devices and systems. As an example, a counter can be implemented by a processor storing the value of the counter in a cell of a memory. The counter values may be used, for example, to track a number of uses or a duration of use of an application program, a circuit or a medium, to facilitate cryptographic operations, etc.

A monotonic counter is a counter whose value is strictly increasing (or decreasing) as additions are made.

BRIEF SUMMARY

In an embodiment, a device comprises: a non-volatile memory, which, in operation, stores a number N of binary words in N memory cells of the non-volatile memory, the N binary words representing a value of a monotonic counter, each binary word having a size sufficient to store a maximum value of the monotonic counter; and control circuitry coupled to the memory, wherein the control circuitry, in operation, increments the value of the monotonic counter by a step size, the incrementing the value of the monotonic counter by the step size including: in response to i memory cells of the N memory cells of consecutive ranks between k modulo N and k+i modulo N each representing a value complementary to a null value, erasing a value of a memory cell of the N memory cells of rank k+i+1 modulo N; and in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein, N is an integer greater than or equal to five, k is an integer, and i is an integer between 2 and N−3.

In an embodiment, a method, comprises: storing a number N of binary words in N memory cells of a non-volatile memory, the N binary words representing a value of a monotonic counter, each binary word having a size sufficient to store a maximum value of the monotonic counter; and incrementing the value of the monotonic counter by a step size. The incrementing the value of the monotonic counter by the step size includes: in response to i memory cells of the N memory cells of consecutive ranks between k modulo N and k+i modulo N each representing a value complementary to a null value, erasing a value of a memory cell of the N memory cells of rank k+i+1 modulo N; and in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein, N is an integer greater than or equal to five, k is an integer, and i is an integer between 2 and N−3.

In an embodiment, a system comprises: a processor, which, in operation, processes data; and a monotonic counter coupled to the processor, wherein the monotonic counter, in operation: stores a number N of binary words in N memory cells of a non-volatile memory, the N binary words representing a value of a monotonic counter, each binary word having a size sufficient to store a maximum value of the monotonic counter; and responds to an indication to increment the value of the monotonic counter by a step size by: in response to i memory cells of the N memory cells of consecutive ranks between k modulo N and k+i modulo N each representing a value complementary to a null value, erasing a value of a memory cell of the N memory cells of rank k+i+1 modulo N; and in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein, N is an integer greater than or equal to five, k is an integer, and i is an integer between 2 and N−3.

In an embodiment, a non-transitory computer-readable medium's contents cause a monotonic counter to perform a method, the method comprising: storing a number N of binary words in N memory cells of a non-volatile memory, the N binary words representing a value of the monotonic counter, each binary word having a size sufficient to store a maximum value of the monotonic counter; and incrementing the value of the monotonic counter by a step size, the incrementing the value of the monotonic counter by the step size including: in response to i memory cells of the N memory cells of consecutive ranks between k modulo N and k+i modulo N each representing a value complementary to a null value, erasing a value of a memory cell of the N memory cells of rank k+i+1 modulo N; and in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein, N is an integer greater than or equal to five, k is an integer, and i is an integer between 2 and N−3.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures, unless the context indicates otherwise. In particular, the structural and/or functional features that are common among the various embodiments may have the same references and may dispose identical or similar structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, within 5%.

In the description, the value of a counter will be referred to as the value of the result of the last operation performed by that counter.

Figure 1:
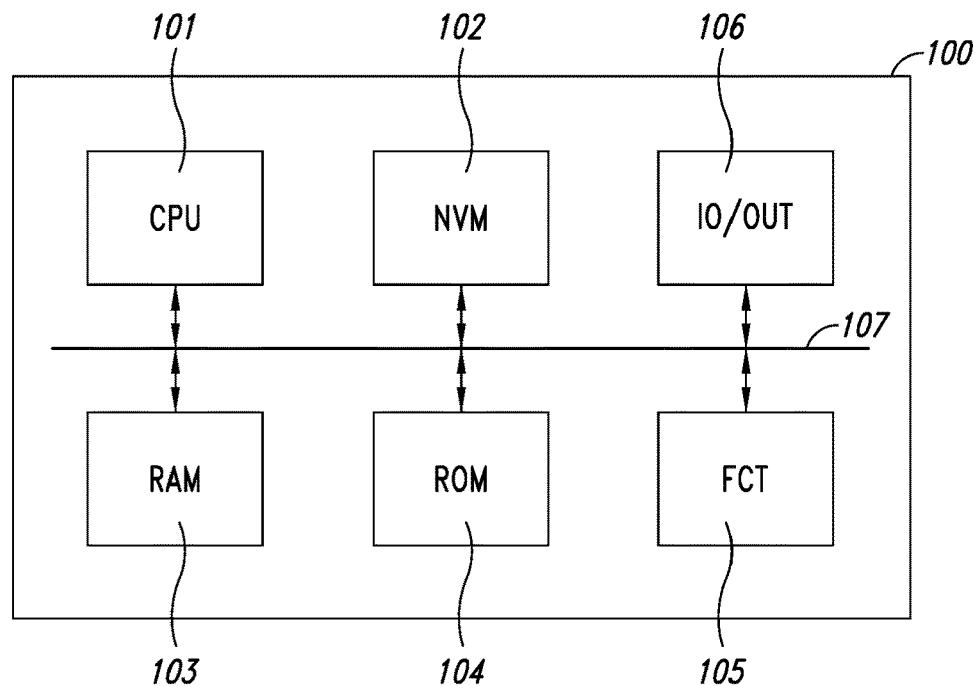
FIG. 1 represents, very schematically and in block form, an electronic device architecture.

FIG. 1 is a block diagram representing, very schematically and in block form, an example of the architecture of an electronic device 100 able to implement a monotonic counter.

The electronic device 100 comprises a processor or circuit 101 (CPU) able to implement various processing of data stored in memories and/or provided by other circuits of the device 100.

The electronic device 100 further comprises different types of memories, including a non-volatile memory 102 (NVM), a volatile memory 103 (RAM), and a read-only memory 104 (ROM). Each memory is able to store different types of data. According to one variant, the electronic device 100 may not comprise a read-only memory 104, whereby software implemented by the device may store its instructions and code only in the volatile memory 103.

The electronic device 100 further comprises different circuits 105 (FCT) able to perform different functions. As an example, the circuits 105 may comprise measurement circuits, data conversion circuits, cryptographic circuits, etc.

The electronic device 100 may further comprise interface circuits 106 (IO/OUT) able to send and/or receive data from outside the device 100. The interface circuits 106 may further be able to implement a data display, for example a display screen.

The electronic device 100 further comprises one or more data buses 107 able to transfer data between its various components. More particularly, the bus 107 is able to transfer data stored in the memories 102 to 104 to the processor 101, the circuits 105, and the interface circuits 106.

Figure 2:
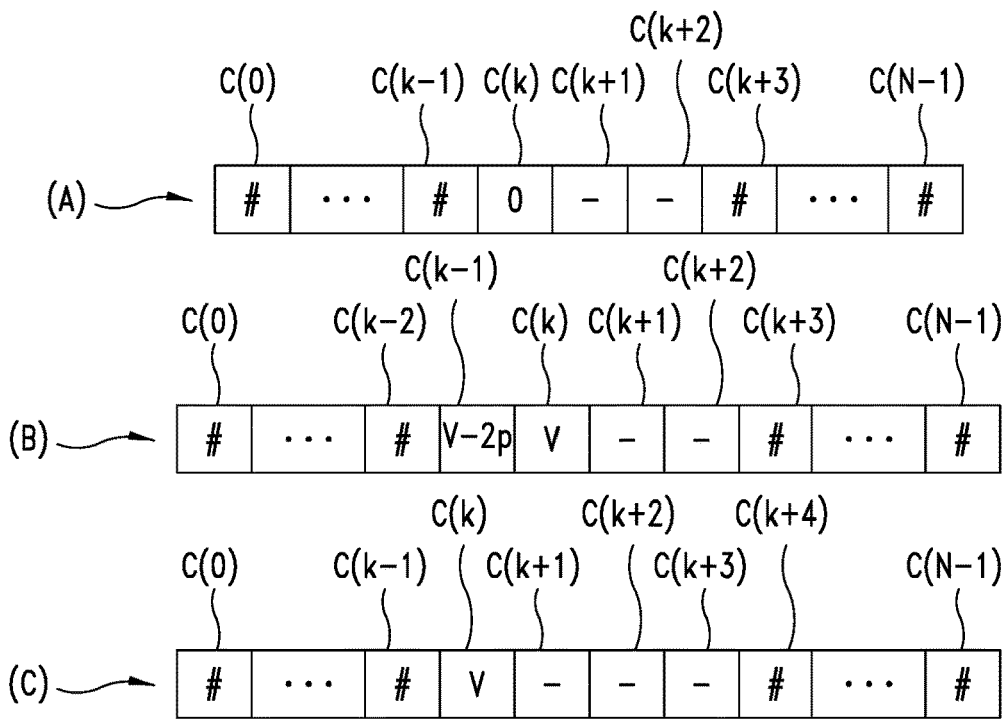
FIG. 2 represents, very schematically and in block form, states of one embodiment of a monotonic counter.

FIG. 2 illustrates three states (A), (B), and (C) of one embodiment of a monotonic counter.

The monotonic counter of the present description is, for example, implemented by an electronic device of the type of the device 100 described in relation to FIG. 1. More particularly, the value of the monotonic counter is stored in memory cells of the non-volatile memory 102. According to one embodiment, the non-volatile memory 102 is a Phase Change Memory (PCM), or an Electrically-Erasable Programmable Read-Only Memory (EEPROM). The storing and incrementing of the value of the monotonic counter in the memory cells may be controlled by control circuitry, such as control circuitry of the processor 101 or control circuitry of a functional circuit 105 or combinations thereof. The stored value may be used, for example, by the processor 101 or the functional circuit 105 or combinations thereof.

The monotonic counter is, in the case described in relation to FIG. 2, a counter adding a fixed step p to its value at each operation. The step is, for example, equal to one. In other words, at each new iteration the value of the counter is incremented by step p.

According to one embodiment, the monotonic counter is implemented using a number N, where N is a natural number greater than or equal to five, of memory cells $C(0)$ to $C(N-1)$. The memory cells $C(0)$ to $C(N-1)$ are, for example, memory cells of the non-volatile memory 102 of FIG. 1. Each memory cell $C(0)$ to $C(N-1)$ is able to store a binary word, for example an octet. In the following, a memory cell is said to represent a value when the said memory cell stores a binary word representing the said value. Furthermore, each memory cell $C(0)$ to $C(N-1)$ is able to store a binary word whose size is large enough to represent a maximum value that can be reached by the monotonic counter. According to one example, the memory cells $C(0)$ to $C(N-1)$ have consecutive memory addresses in memory 102. According to an alternative embodiment, the memory cells $C(0)$ to $C(N-1)$ do not have consecutive memory addresses in the memory 102.

In FIG. 2, and in FIGS. 3 to 10, the following symbols will be used to represent certain special values of the memory cells $C(0)$ to $C(N-1)$:

the symbol "0" indicates that the null value has been written to the memory cell;

the symbol "−" indicates that the value of the memory cell has been erased, also called hereafter erased value "−," the memory cell represents then a complementary value to the null value "0"; and the symbol "#" indicates that any value, but different from the value represented by the symbol "−," has been written to the memory cell.

According to one example, if a memory cell stores an octet, the null value is the value zero (0), and the complementary value to the null value is the value two hundred fifty-five (255) or the value FF in hexadecimal.

In addition, a memory cell C(j) may also be referred to as a memory cell C(j) of rank j modulo N, or of rank j, where j is an integer and designates the place of the memory cell within the N memory cells of the monotonic counter.

The state (A) of the monotonic counter is its initial state in which the value of the counter is equal to the zero value "0." In state (A), all memory cells C(0) to C(N−1) show any value "#" except:

a memory cell C(k) of rank k modulo N, k being a natural number, which represents the null value "0"; and two memory cells C(k+1) and C(k+2) whose ranks are successive to the memory cell C(k), which have been erased and which therefore show the value "−."

State (B) of the monotonic counter is the state in which the value of the counter is a value V different from the zero value "0" and the value "−." In state (B), all memory cells C(0) to C(N 1) represent any value "#" except:

a memory cell C(k), or memory cell C(k) of rank k modulo N, which represents the value V.

a memory cell C(k−1) which represents the value V subtracted of twice the step p of the counter; and two memory cells C(k+1) and C(k+2) whose rank is successive to the memory cell C(k), which have been erased and which therefore represent the value "−."

The state (C) of the monotonic counter is the state in which the counter value is the value V incremented by the step p. In state (C) all memory cells C(0) to C(N−1) represent any value "#" except:

one memory cell C(k) of rank k modulo N which represents the value V; and three memory cells C(k+1), C(k+2), and C(k+3) whose rank is successive to memory cell C(k), which have been erased and thus represent the value "−."

The two main states of the monotonic counter are states (B) and (C), state (A) being the special case of state (B) where the value V is the null value "0." An incrementing step of the monotonic counter allows to pass from the state (B) to the state (C), or from the state (C) to the state (B). An incrementing operation from the state (B) to state (C) is described in relation to FIG. 3. An incrementing operation from state (C) to state (B) is described in relation to FIG. 4.

Figure 3:
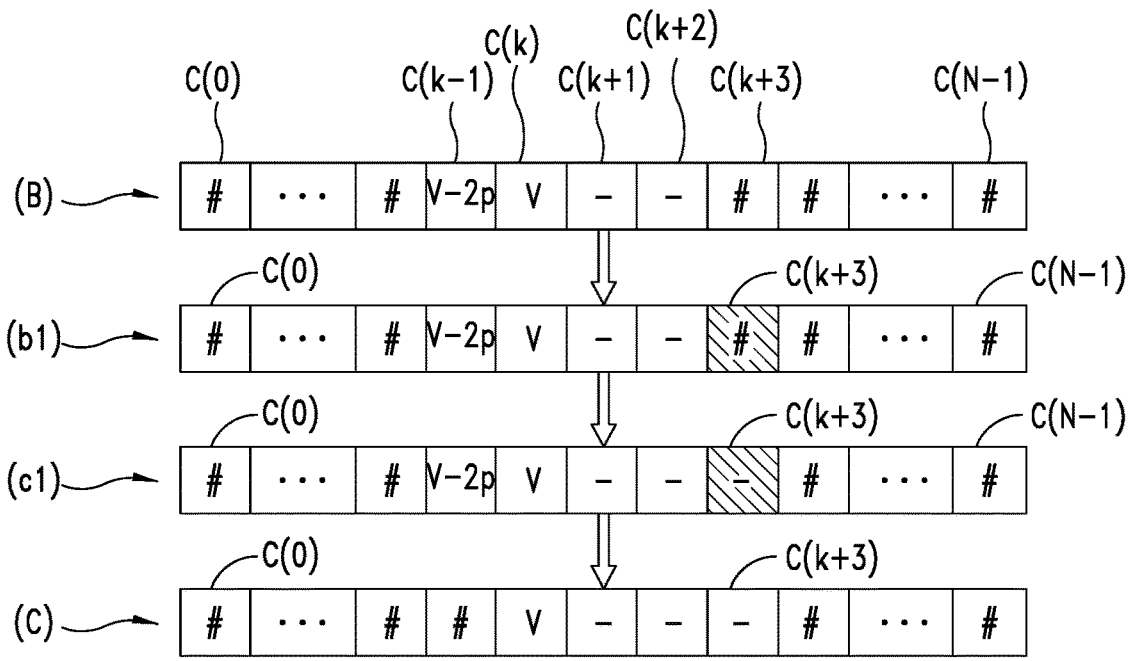
FIG. 3 represents, very schematically and in block form, a mode of implementation of steps for incrementing a state of the counter of FIG. 2.

FIG. 3 represents, very schematically and in block form, a mode of implementation of the steps of an incrementing operation allowing the monotonic counter described in relation to FIG. 2 to pass from state (B) to state (C).

The states (A), (B) and (C) of the monotonic counter have been described in relation to FIG. 2, the same references and notations are used here to designate them.

For the record, the state (B) is characterized by a memory cell showing the value V of the monotonic counter, followed by two consecutive memory cells showing the erased value "−," and preceded by a memory cell showing the value V subtracted by two times the counter step p. State (C) is characterized by a memory cell showing the V value followed by three memory cells showing the erased value "−."

The incrementing operation allowing to pass from the state (B) to state (C) is a step of erasing the first memory cell C(k+3), representing any value "#," and following the two memory cells C(k+1) and C(k+2) representing the value "−." Once the memory cell C(k+3) is erased, the memory cell C(k) is followed by three erased memory cells, and we return to the configuration of the state (C).

During the implementation of this incrementing operation, the memory cells C(0) to C(N−1) of the monotonic counter pass through different stable states and unstable states. An unstable state is a state of a memory cell where the value it represents is unreliable. The stable or unstable character of a cell is deduced from the configuration of a group of memory cells. According to one example, if a memory cell presents a surprising value, then it can be considered unstable. In FIGS. 3 to 9, a memory cell with an unstable state is hatched. The sequence of these states is described below. An example of a method for stabilizing these states is described next.

At the beginning of the incrementing operation, the counter is in the stable state (B). In other words, all memory cells C(0) to C(N−1) of the counter show a reliable value.

Upon receiving the erase command for memory cell C(k+3), the counter passes to a state (b1) similar to state (B) but in which the value of memory cell C(k+3) is unreliable. In this state (b1), memory cell C(k+3) still represents some value "#" but not reliably, so in FIG. 3, memory cell C(k+3) is hatched.

During implementation of the erase command for memory cell C(k+3), the counter passes to a state (c1) similar to state (C) but in which the value of the memory cell C(k+3) is unreliable. In this state (c1), the memory cell C(k+3) represents the "−" value complementary to the null value but not reliably, so in FIG. 3, the memory cell C(k+3) is still hatched.

Once the erase operation is complete, the monotonic counter is in the stable (C) state, as described in relation to FIG. 2.

Occasionally, the monotonic counter may experience impromptu stops during the implementation of, for example, an increment operation. When the counter is restarted, it may be in an unstable state. If the state is unstable, then the monotonic counter implements a stabilization method thus allowing to make the state stable.

The stabilization method implemented for a state of the type of state (b1) allows the return to a stable state (B). This method is as follows:

confirming the value of the memory cell C(k), by programming the value it represents:

erasing the value of the memory cell C(k+2), so that it represents the value "−" complementary to the null value "0"; and writing the null value "0" in the memory cell C(k+3).

The null value "0" written in the memory cell C(k+3) is processed, in the further implementation of the monotonic counter, as any value "#." According to one embodiment, any value "#" different from the null value "0" and the value "−" may be written into the memory cell C(k+3).

The stabilization method implemented for a state of the type of state (c1) allows it to return to a stable state (C). This method includes successively erasing the memory cells C(k+1), C(k+2) and C(k+3), so that they all represent the value "−" complementary to the null value "0."

Figure 4:
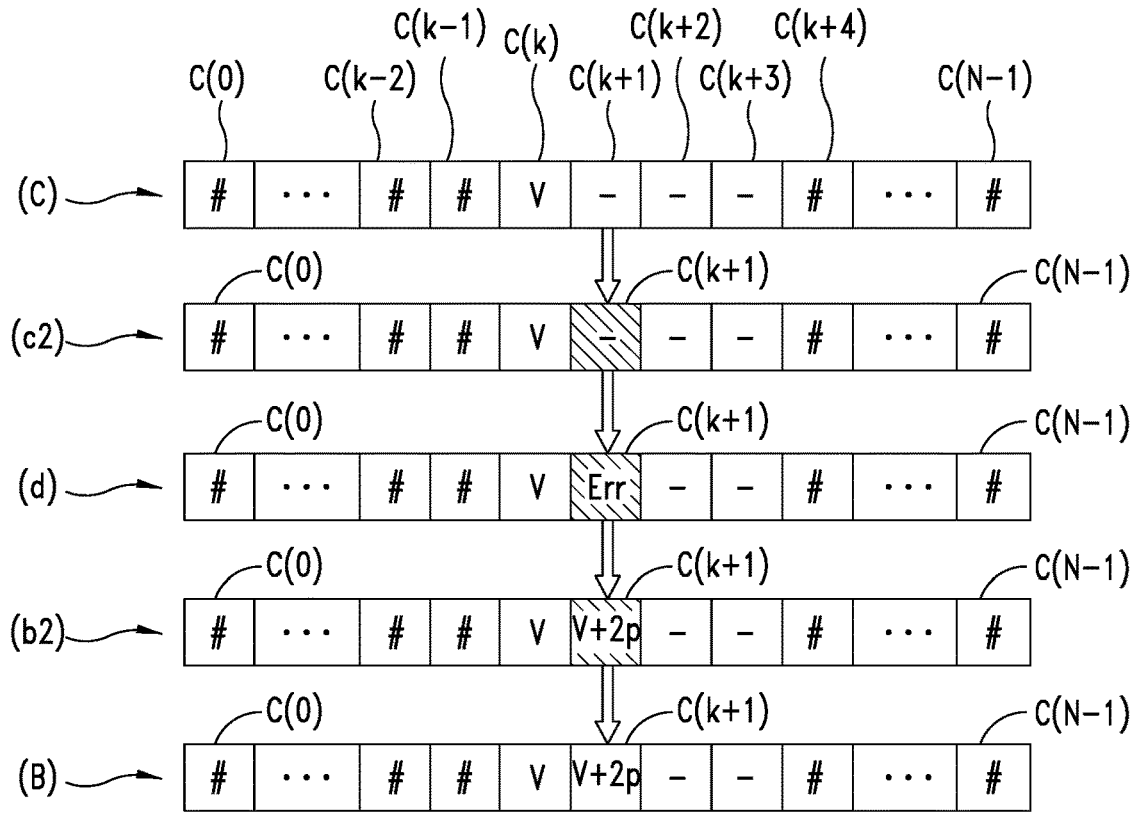
FIG. 4 represents, very schematically and in block form, a mode of implementation of steps for incrementing another state of the counter of FIG. 2.

FIG. 4 represents, very schematically and in block form, a mode of implementation of steps of an incrementing operation allowing to pass from the state (C) to the state (B) of the monotonic counter described in relation to FIG. 2.

The stable states (A), (B) and (C) of the monotonic counter have been described in relation to FIG. 2 and the unstable states (b1) and (c1) have been described in relation to FIG. 3, the same references and notations are used here to refer to them.

In FIG. 4, the state (C) is characterized by a memory cell representing the value V followed by three memory cells representing the erased value "−." In the state (C), the monotonic counter then represents the value V incremented by the step p (V+p). The state (B) is characterized by a memory cell showing the value V incremented by two times the step p (V+2p), followed by two consecutive memory cells representing the erased value "−," and preceded by a memory cell showing the value V subtracted by two times the step p of the counter. In the state (B), the counter shows the value V+2p.

The incrementing operation to pass from the state (C) to state (B) is a step of writing the first memory cell C(k+1) of the three memory cells C(k+1), C(k+2), and C(k+3) representing the "−" value of state (C). More precisely, the value V of the cell C(k) incremented by twice the step p, noted then V+2p is written in the memory cell C(k+1). We then find the configuration of the state (B), the two memory cells C(k) and C(k+1) represent non-zero values and whose difference is equal to twice the step p, and the memory cells C(k+2) and C(k+3) represent the erased value "−" complementary to the zero value "0."

As with the incrementing operation described in relation to FIG. 3, during the implementation of this incrementing operation, the memory cells C(0) to C(N−1) of the monotonic counter pass through different stable states and unstable states. The succession of these states is described below. An example method for stabilizing these states is described next.

At the beginning of the increment operation, the counter is in the stable state (C). In other words, all memory cells C(0) to C(N−1) of the counter represent a reliable value.

Upon receiving the write command from the memory cell C(k+3), the counter passes to a state (c2) similar to state (C) but in which the value in the memory cell C(k+1) is unreliable. In this state (c2), the memory cell C(k+1) still represents the erased value "−" complementary to the null value "0" but not reliably. Thus, in FIG. 4, state c2, the memory cell C(k+1) is hatched.

During implementation of the write command to memory cell C(k+1), the counter passes to a state (d) similar to state (B) but in which the value of the memory cell C(k+1) no longer shows the erased value "−" and does not yet represent the value V+2p. In this state (d), the memory cell C(k+1) represents an erroneous value Err different from the value "−" and from the value V+2p which is unreliable. Thus, in FIG. 4, state d, the memory cell C(k+1) is hatched.

As the write operation is completed, the counter passes to a state (b2) similar to the state (B) but in which the value of memory cell C(k+1) is still unreliable. In this state (b2), the memory cell C(k+1) represents the value V+2p but not reliably. Thus, in FIG. 4, state b2, the memory cell C(k+1) is hatched.

Once the erase operation is completed, the monotonic counter is in the stable (B) state, such as that described in relation to FIG. 2.

As with the increment operation described in relation to FIG. 3, if after a restart the counter state is unstable, a stabilization method allowing to make the state stable is implemented.

The stabilization method implemented for a state of the type of state (c2) is the same as that for the state (c1) described in relation to FIG. 3 and allows the return to a stable state (C). In other words, it is the successive erasure of the memory cells C(k+1), C(k+2) and C(k+3), so that they all represent the value "−" complementary to the null value "0."

The stabilization method implemented for a state of the type of state (b2) is the same as that for the state (b1) described in relation to FIG. 3 and allows for a return to a stable state (B). In other words, this method includes the following steps:
  confirming the value of the memory cell C(k+1), by programming the value it represents:
  erasing the value of memory cell C(k+3), so that it represents the value "−" complementary to the null value "0"; and
  writing the null value "0" to memory cell C(k+4).

The stabilization method implemented for a state of the type of state (d) includes rewriting the value of memory cell C(k+1), so that it represents the value V+2p and not the erroneous value Err.

An advantage of the incrementing operations described in relation to FIGS. 3 and 4 is that they allow minimizing the number of elementary write and erase operations of an incrementing operation. Indeed, in a monotonic counter whose value is written in a single memory cell, each incrementing operation requires an elementary operation of erasing the value from the memory cell, then an elementary operation of writing the incremented value in the memory cell. The incrementing operations of the present embodiment allow the number of elementary operations to be divided by two. Reducing the number of elementary operations allows to reduce the power consumption of the counter, to increase its execution speed, and to improve its endurance. It is said that the more enduring a counter is, the greater the number of operations it can implement during the lifetime of the device executing it.

Figure 5:
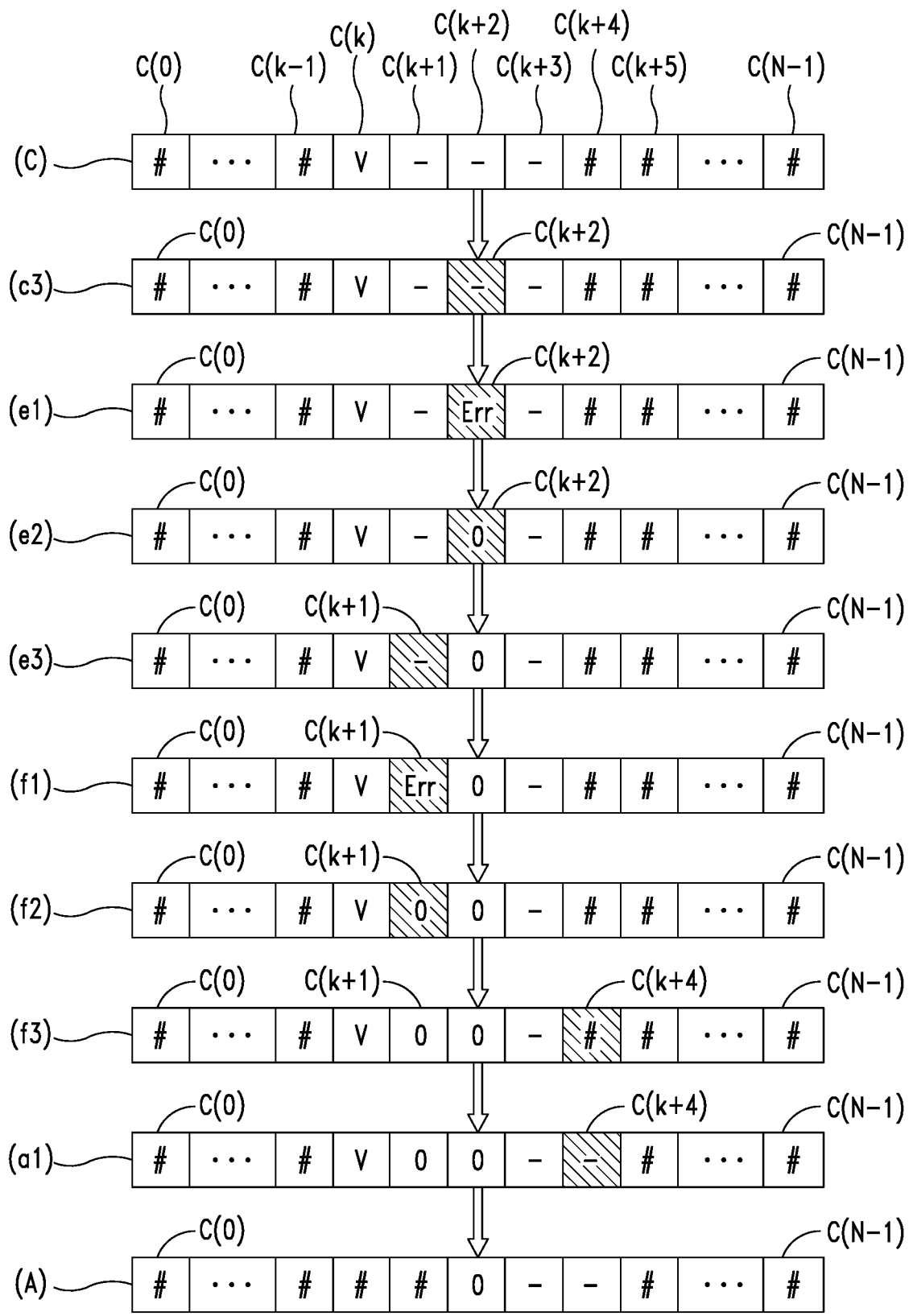
FIG. 5 represents, very schematically and in block form, a mode of implementation of steps of an initialization operation of a state of the counter of FIG. 2.

FIG. 5 represents, very schematically and in block form, a mode of implementation of the steps of an initialization operation of a state (C) allowing it to pass from the state (C) to state (A) of the monotonic counter described in relation to FIG. 2.

The stable states (A), (B) and (C) of the monotonic counter have been described in relation to FIG. 2 and the unstable states (b1), (b2), (c1), (c2), and (d) have been described in relation to FIGS. 3 and 4, the same references and notations are used here to designate them.

For the record, the state (A) is characterized by a memory cell representing the zero value "0" of the monotonic counter, followed by two consecutive memory cells representing the erased value "−." The state (C) is characterized by one memory cell representing the V value followed by three memory cells representing the erased value "−."

For a state (C) identical to the state (C) described in relation to FIG. 2, the initialization operation of the state (C) comprises the following successive steps:
  writing the null value "0" in the memory cell C(k+2).
  writing the null value "0" in the memory cell C(k+1), this null value "0" is equated to, in the continuation of the implementation of the operation, as any value "#," and thus a variant here would be to write any value "#" in the memory cell C(k+1); and
  erasing the value in memory cell C(k+4), so that it shows the erased value "−".

As with the incrementing operations described in relation to FIGS. 3 and 4, during the implementation of this initialization operation, the memory cells C(0) to C(N−1) of the monotonic counter pass through various stable states and unstable states. The succession of these states is described below. Examples of the method for stabilizing these states are described in relation to FIGS. 7 and 8.

At the beginning of the initialization operation, the counter is in the stable state (C). That is, all memory cells C(0) to C(N−1) of the counter show a reliable value.

During the step of writing the null value "0" to the memory cell C(k+2), the counter goes through a succession of three unstable states (c3), (e1) and (e2) where the value represented by memory cell C(k+2) is unreliable. In the state (c3), the memory cell C(k+2) still represents the erased value "−" complementary to the null value "0." In the state (e1), the memory cell C(k+2) represents the erroneous value Err different from the value "−" and the null value "0." In the state (e2), the memory cell C(k+2) already represents the null value "0."

During the step of writing the null value "0" in the memory cell C(k+1), the counter passes through a succession of three unstable states (e3), (f1) and (f2) where the value shown by the memory cell C(k+1) is unreliable. In the state (e3), the memory cell C(k+1) still represents the erased value "−" complementary to the null value "0." In the state (f1), the memory cell C(k+1) represents the erroneous value Err different from the value "−" and the null value "0." In the state (f2), the memory cell C(k+1) already represents the null value "0."

During the step of erasing the memory cell C(k+4), the counter goes through a succession of two states (f3), (a1) where the value represented by the memory cell C(k+4) is unreliable. In the state (f3), the memory cell C(k+1) still represents any value "#." In the state (a1), the memory cell C(k+4) already represents the deleted value "−."

As with the incrementing operations described in relation to FIGS. 3 and 4, if, after a restart, the counter state is unstable, a stabilization method to make the state stable is implemented.

The method for stabilizing the state (c3) is the same as the method for stabilizing the states (c1) and (c2) described in connection with FIGS. 3 and 4. In other words, it is the successive erasure of the memory cells C(k+1), C(k+2) and C(k+3), so that they all represent the value "−" complementary to the null value "0."

The method for stabilizing states of the type of states (e1), (e2) and (e3) is common to these three states. This method is described in more detail in relation to FIG. 7.

The method for stabilizing states of the type of states (f1), (f2) and (f3) is common to these three states. This method is described in more detail in connection with FIG. 8.

The stabilization method implemented for a state of the type of state (a1) comprises erasing the memory cell C(k+4), so that it represents the value "−" complementary to the null value "0."

Figure 6:
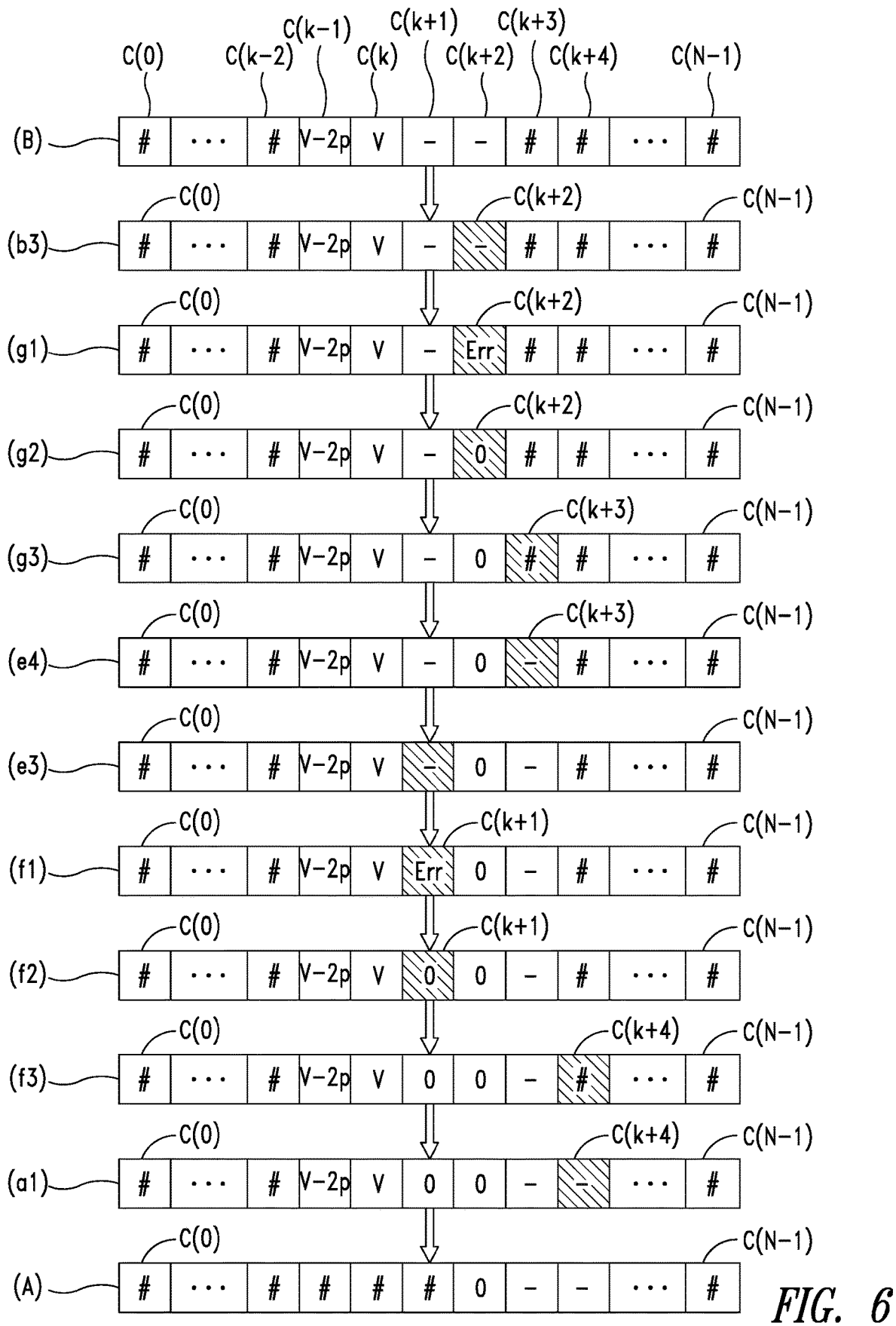
FIG. 6 represents, very schematically and in block form, a mode of implementation of steps of an initialization operation of another state of the counter of FIG. 2.

FIG. 6 represents, very schematically and in block form, a mode of implementation of the steps of an initialization operation of the state (B) allowing it to pass from the state (B) to the state (A) of the monotonic counter described in relation to FIG. 2.

The stable states (A), (B) and (C) of the monotonic counter have been described in relation to FIG. 2, the unstable states (b1), (b2), (c1) to (c3), (d), (e1) to (e3), and (f1) to (f3) have been described in relation to FIGS. 3 to 5, and the same references and notations are used herein to designate them.

For the record, state (B) is characterized by a memory cell representing the value V of the monotonic counter, followed by two consecutive memory cells representing the erased value "−," and preceded by a memory cell representing the value V subtracted by two times the counter step p. The state (A) is characterized by a memory cell representing the zero value "0" of the monotonic counter, followed by two consecutive memory cells representing the erased value "−."

For a state (B) identical to the state (B) described in relation to FIG. 2, the initialization operation of the state (B) comprises the following successive steps:

writing the null value "0" in the memory cell C(k+2).
erasing the memory cell C(k+3).
writing the null value "0" in the memory cell C(k+1), this null value "0" is equated to, in the continuation of the implementation of the operation, as an unspecified value "#," and thus a variant here would be to write an unspecified value "#" in the memory cell C(k+1); and
erasing the value of the memory cell C(k+4), so that it shows the erased value "−."

As with the incrementing operations described in relation to FIGS. 3 and 4 and the initialization operation described in relation to FIG. 5, during the implementation of this initialization operation, the memory cells C(0) to C(N−1) of the monotonic counter pass through different stable states and unstable states. The succession of these states is described below. Examples of the method for stabilizing these states are described in relation to FIGS. 7 to 9.

During the step of writing the null value "0" in the memory cell C(k+2), the counter passes through a succession of three states (b3), (g1) and (g2) where the value represented by the memory cell C(k+2) is unreliable. In the state (b3), the memory cell C(k+2) still represents the erased value "−" complementary to the zero value "0." In the state (g1), the memory cell C(k+2) represents the erroneous value Err different from the value "−" and the null value "0." In the state (g2), the memory cell C(k+2) already represents the null value "0."

During the step of erasing the memory cell C(k+3), the counter goes through a succession of two states (g3) and (e4) where the value representing the memory cell C(k+3) is unreliable. In the state (g3), the memory cell C(k+3) still represents any value "#." In the state (e4), the memory cell C(k+3) is probably already representing the deleted value "−."

During the step of writing the null value "0" to the memory cell C(k+1), the counter goes through a succession of three states (e3), (f1) and (f2) where the value represented by the memory cell C(k+1) is unreliable. In the state (e3), the memory cell C(k+1) still represents the erased value "−" complementary to the null value "0." In the state (f1), the memory cell C(k+1) represents the erroneous value Err different from the value "−" and the null value "0." In the state (f2), the memory cell C(k+1) already represents the null value "0."

During the step of erasing the memory cell C(k+4), the counter passes through a succession of two states (f3) and (a1) where the value represented by the memory cell C(k+4) is unreliable. In the state (f3), the memory cell C(k+1) still represents any value "#." In the state (a1), the memory cell C(k+4) still represents the deleted value "−."

As with the incrementing operations described in relation to FIGS. 3 and 4 and the initialization operation described in relation to FIG. 5, if, after a restart, the counter state is unstable, a stabilization method allowing to make the state stable is implemented.

The stabilization method implemented for a state of the type of state (b3) is the same as the method for stabilizing states (b1) and (b2) described in relation to FIGS. 3 and 4. In other words, this method comprises the following steps:

confirming the value of the memory cell C(k), by programming the value it represents;

erasing the value of the memory cell C(k+2), so that it represents the value "−" complementary to the null value "0"; and writing the null value "0" to the memory cell C(k+3).

The method for stabilizing the states of the type of states (g1), (g2), and (g3) is common to these three states. This method is described in more detail in relation to FIG. 9.

The method for stabilizing the states of the type of states (f1), (f2), and (f3) is common to these three states. This method is described in more detail in relation to FIG. 8.

The method for stabilizing states of the type of states (e1), (e2), (e3), and (e4) is common to these four states. This method is described in more detail in relation to FIG. 10.

The stabilization method implemented for a state of the type of state (a1) comprises erasing the memory cell C(k+4), so that it represents the value "−" complementary to the null value "0."

Figure 7:
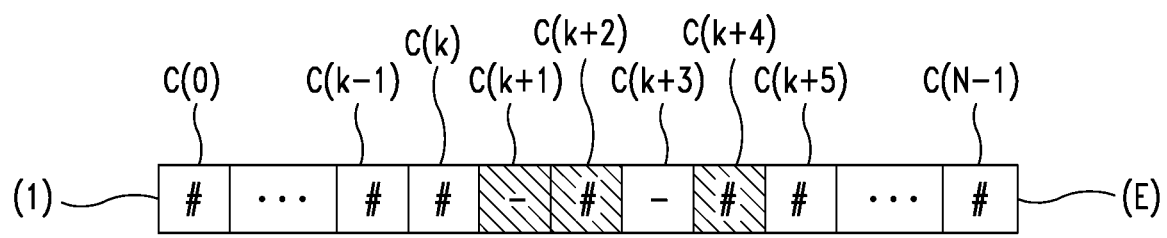
FIG. 7 represents, very schematically and in block form of, two views illustrating a mode of implementation of steps for stabilizing states of the counter of FIG. 2.
Figure 7:
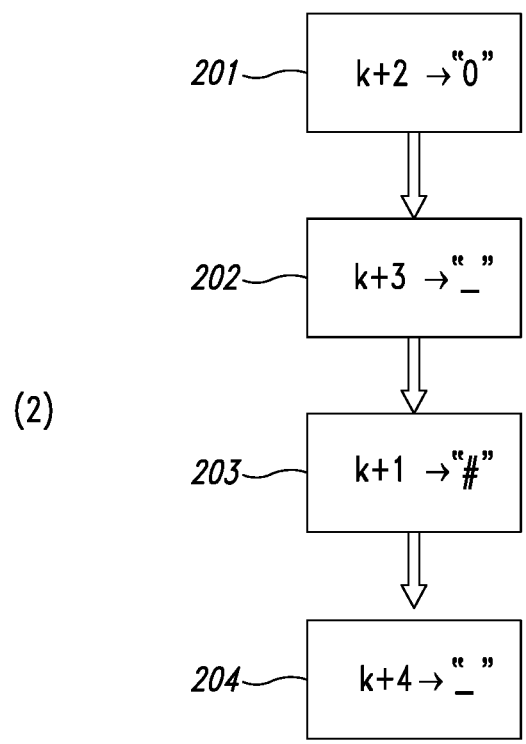

FIG. 7 shows, very schematically and in block form, a mode of implementation of steps of a method for stabilizing a state (E) of the monotonic counter described in relation to FIG. 2. FIG. 7 includes a view (1) showing the state (E) of the counter, and a block diagram (2) representing the implementation of the steps of the method for stabilizing the state (E).

The state (E) of the monotonic counter is an unstable state of the monotonic counter described in relation to FIG. 2 in which two memory cells representing the erased value "−" complementary to the null value "0" are separated by an "inner" memory cell representing any value "#." According to a variant, the "inner" memory cell can represent the null value "0." In other words, in state (E) all memory cells C(0) to C(N−1) represent any value "#" except:

a memory cell C(k+1) which represents the erased value "−"; and/or a memory cell C(k+3) which represents the erased value "−."

In state (E), memory cells C(k+1), C(k+2) and C(k+4) may be memory cells representing an unstable value, and memory cell C(k+3) is a memory cell with a stable value. The unstable states (e1), (e2), (e3), and (e4) described in relation to FIGS. 5 and 6 can be equated with the state (E), therefore they have a common stabilization method.

The method for stabilizing the state (E) is a method for passing from the state (E) to a state of the type of the initial state (A) described in relation to FIG. 2.

In a step 201 (k+2−>"0"), the memory cell C(k+2) is written so that its value represents the null value "0."

At a step 202 (k+3−>"−"), the memory cell C(k+3) is erased so that its value represents the erased value "−" complementary to the null value "0."

In a step 203 (k+1−>"#"), the memory cell C(k+2) is written so that its value represents any value "#." According to a variant, the memory cell C(k+2) is written so that its value represents the null value "0."

In a step 204 (k+4−>"−"), the memory cell C(k+4) is erased so that its value represents the erased value "−" complementary to the null value "0."

After the step 204, the monotonic counter is in the state (A), since all memory cells C(0) to C(N−1) show any value "#" except the memory cell C(k+2) which represents the null value "0," and the memory cells C(k+3) and C(k+4) which represent the erased value "−."

Figure 8:
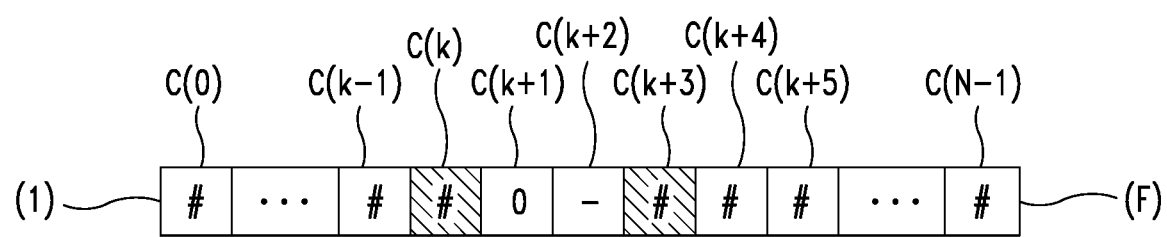
FIG. 8 represents, very schematically and in block form, two views illustrating a mode of implementation of steps for stabilizing other states of the counter of FIG. 2.
Figure 8:
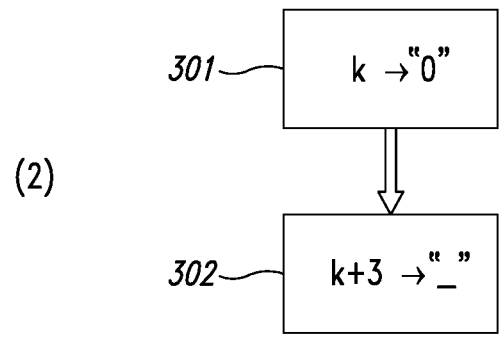

FIG. 8 represents, very schematically and in block form, a mode of implementation of the steps of a method for stabilizing a state (F) of the monotonic counter described in relation to FIG. 2. FIG. 8 comprises a view (1) representing the state (F) of the counter, and a block diagram (2) representing the implementation of steps of the method for stabilizing the state (F).

The state (F) of the monotonic counter is an unstable state of the monotonic counter described in relation to FIG. 2 in which a stable memory cell representing the null value "0" is preceded by an unstable memory cell representing any value "#" and is followed by a stable memory cell representing the erased value "−." The memory cell representing the value "−" is followed by an unstable memory cell representing any value "#." In other words, in the state (F) all the memory cells C(0) to C(N−1) represent any value "#" except:

the memory cell C(k+1) which represents the null value "0"; and the memory cell C(k+2) which represents the erased value "−" complementary to the null value "0."

In the state (F), the memory cells C(k) and C(k+3) may be memory cells representing an unstable value, and the memory cells C(k+1) and C(k+2) are memory cells with stable values. The unstable states (f1), (f2), and (f3) described in relation to FIG. 5 can be equated to the state (F), which is why they have a common stabilization method.

The method for stabilizing the state (F) is a method for passing from the state (F) to a state of the type of the initial state (A) described in relation to FIG. 2.

At a step 301 (k−>"0"), the memory cell C(k) is written so that its value represents the null value "0."

At a step 302 (k+3−>"−"), the memory cell C(k+3) is erased so that its value represents the erased value "−" complementary to the null value "0."

After the step 302, the monotonic counter is in state (A), since all memory cells C(0) to C(N−1) represent any value "#" except memory cell C(k+1) which represents the null value "0," and the memory cells C(k+2) and C(k+3) which represent the erased value "−."

Figure 9:
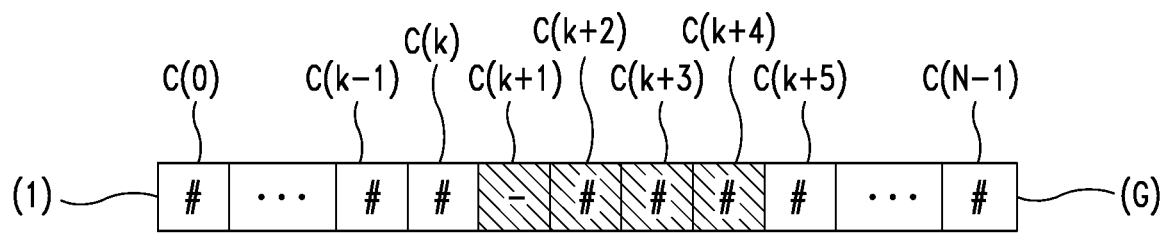
FIG. 9 represents, very schematically and in block form, two views illustrating a mode of implementation of steps for stabilizing another state of the counter of FIG. 2.
Figure 9:
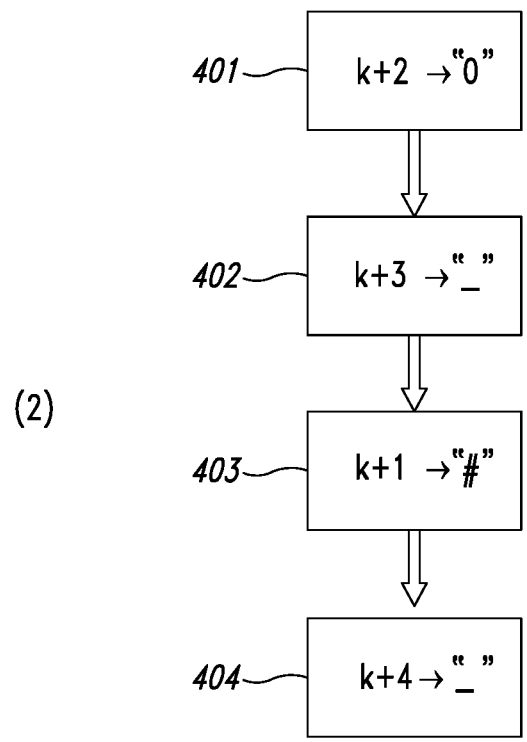

FIG. 9 represents, very schematically and in block form, a mode of implementation of a method for stabilizing a state (G) of the monotonic counter described in relation to FIG. 2. FIG. 9 comprises a view (1) representing the state (G) of the counter, and a block diagram (2) representing the implementation of the steps of the method for stabilizing the state (G).

The state (G) of the monotonic counter is an unstable state of the monotonic counter described in relation to FIG. 2 in which a stable memory cell representing any value "#" is followed by four memory cells whose value is unstable. Specifically, in state (G) all memory cells C(0) to C(N−1) are stable and represent any value "#" except:

the memory cell C(k+1) which is unstable and represents the erased value "−" complementary to the null value "0."

the memory cell C(k+2) which is unstable and which represents any value "#" different from the null value "0."

the memory cell C(k+3) which is unstable and which represents any value "#"; and/or memory cell C(k+4) that is unstable and represents any value "#."

The unstable states (g1), (g2), and (g3) described in relation to FIG. 6 can be equated to the state (G), which is why they have a common stabilization method.

The method for stabilizing the state (G) is a method which allows passing from the state (G) to a state of the type of the initial state (A) described in relation to FIG. 2.

In a step 401 (k+2->"0"), the memory cell C(k+2) is written so that its value represents the null value "0."

In a step 402 (k+3->"–"), the memory cell C(k+3) is erased so that its value represents the erased value "–" complementary to the null value "0."

In a step 403 (k+1->"#"), the memory cell C(k+2) is written so that its value represents any value "#." According to a variant, the memory cell C(k+2) is written so that its value represents the null value "0."

In a step 404 (k+4->"–"), the memory cell C(k+4) is erased so that its value represents the erased value "–" complementary to the null value "0."

After step 404, the monotonic counter is in the state (A), since all memory cells C(0) to C(N−1) represent any value "#" except memory cell C(k+2) which represents the null value "0," and the memory cells C(k+3) and C(k+4) which represent the erased value "–."

It should be noted that the state stabilization method (E) described in relation to FIG. 7 and the state stabilization method (G) described in relation to FIG. 9 are identical.

Figure 10:
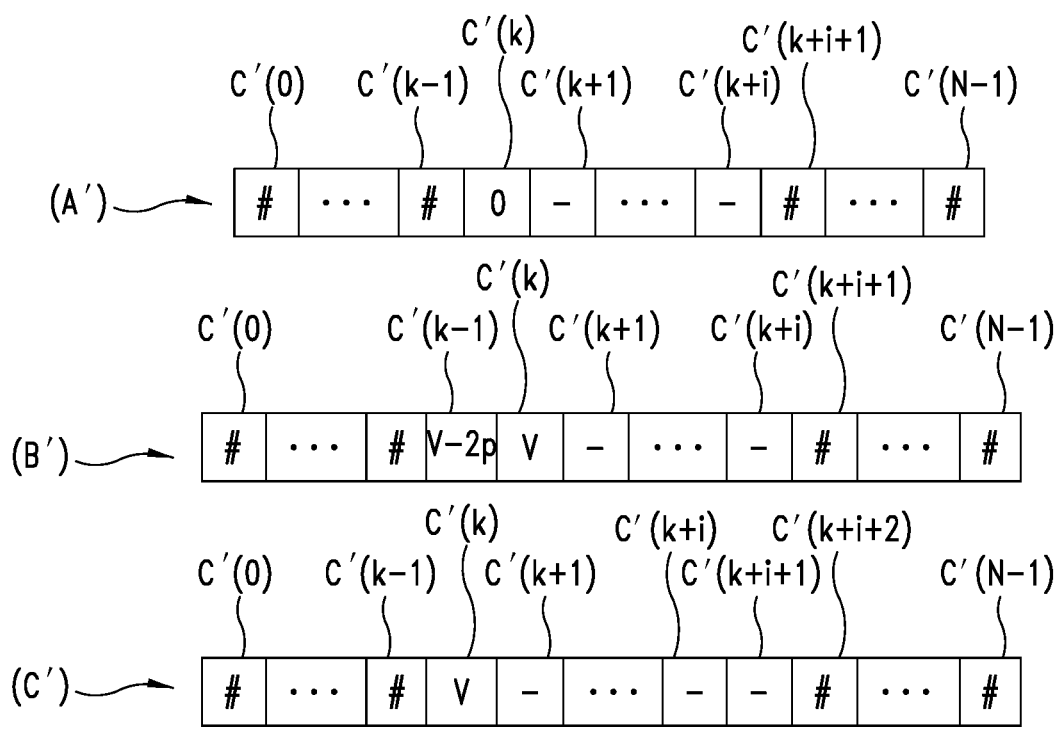
FIG. 10 represents, very schematically and in block form, states of another embodiment of a monotonic counter.

FIG. 10 illustrates three states (A'), (B') and (C') of another embodiment of a monotonic counter.

The monotonic counter described in relation to FIG. 10 is similar to the monotonic counter described in relation to FIGS. 1 to 9. The common elements of these two counters are not described again here, and only their differences are highlighted. In particular, the notations of different values that a memory cell can show are kept here.

According to one embodiment, the monotonic counter of FIG. 10 is implemented using a number N, where N is a natural number greater than or equal to five of memory cells C'(0) to C'(N−1). The memory cells C'(0) to C'(N−1) are, for example, memory cells of the non-volatile memory 102 of FIG. 1. Each memory cell C'(0) to C'(N−1) is able to store a binary word, for example an octet. In addition, each memory cell C'(0) to C'(N 1) is able to store a binary word whose size is large enough to represent a maximum value that can be reached by the monotonic counter. According to one example, the memory cells C'(0) to C'(N−1) have consecutive memory addresses in memory 102. According to a variant, the memory cells C'(0) to C'(N−1) do not have consecutive memory addresses in the memory 102.

The state (A') of the monotonic counter is its initial state in which the value of the counter is equal to the null value. The state (A') is similar to state (A) described in relation to FIG. 2 but differs in that the memory cell C'(k) representing the null value "0" is followed by, for i an integer between 2 and N−3, i consecutive memory cells representing the erased value "–." In other words, in the state (A') all the memory cells C'(0) to C'(N−1) show any value "#" except:
  the memory cell C'(k) which represents the null value "0"; and
  i memory cells C'(k+1) to C'(k+i) which have been erased and therefore show the value "–."

The state (B') of the monotonic counter is the state in which the counter value is a value V different from the null value "0" and the value "–." The state (B') is similar to the state (B) described in relation to FIG. 2 but differs in that consecutive memory cells C'(k−1) and C'(k) representing, respectively, the value V−2p and the value V are followed by i consecutive memory cells C'(k+1) to C'(k+i) representing the erased value "–." In other words, in the state (B') all memory cells C'(0) to C'(N 1) represent any value "#" except:
  a memory cell C'(k) which represents the value V.
  a memory cell C'(k−1) which represents the value V subtracted by two times the step p of the counter; and
  i memory cells C'(k+1) to C'(k+i) which have been erased and which therefore represent the value "–."

The state (C') of the monotonic counter is the state in which the counter value is the value V incremented by step p. The state (C') is similar to state (C) described in relation to FIG. 2 but differs in that the memory cell C'(k) representing the value V is followed by i+1 consecutive memory cells representing the erased value "–." In other words, in the state (C') all memory cells C'(0) to C'(N 1) represent any value "#" except:
  one memory cell C'(k) which represents the value V; and
  i+1 memory cells C'(k+1) to C'(k+i+1) whose rank is successive to the memory cell C'(k), which have been erased and which therefore represent the value "–."

The two main states of the monotonic counter are the states (B') and (C'), the state (A') being the particular case of state (B') where the value V is the null value "0." A step of incrementing the monotonic counter allows to pass from the state (B') to the state (C'), or from the state (C') to the state (B'). Using the incrementing operations described in relation to FIGS. 3 and 4, it is obvious to the person skilled in the art to implement the incrementing operation from the state (B') to state (C'), and the incrementing operation from the state (C') to state (B'). Similarly, initialization operations of the states (B') and (C') and the stabilization methods are obvious to the person skilled in the art from the descriptions in FIGS. 5 to 9.

In particular, an incrementing step allowing to pass from the state (B') to state (C') would comprise clearing the memory cell C'(k+i+1), and an incrementing step to pass from the state (C') to state (B') would comprise writing the value of the counter incremented by twice the step p to the memory cell C'(k+1).

Various embodiments and variants have been described. Those skilled in the art will understand that certain features of these embodiments and variants "can be combined and other variants will readily occur to those skilled in the art."

Finally, the practical implementation of the embodiments and variants described herein is within the capabilities of those skilled in the art based on the functional description provided hereinabove.

One embodiment facilitates addressing all or some of the drawbacks of known monotonic counter implementations.

One embodiment provides a monotonic counter whose value is shown by a number N of binary words stored in N memory cells of a non-volatile memory, each binary word having a size able to represent the maximum value of the said counter, and being able to implement a one-step incrementing operation wherein:
  if i first memory cells of consecutive ranks between k modulo N and k+i modulo N, represent a value complementary to the null value, then the value of a second cell, of rank k+i+1 modulo N, is erased; and
  if i+1 third memory cells of consecutive ranks between k+1 modulo N and k+i+1 modulo N represent a value complementary to the null value, then the value incremented by two times the step of a fourth memory cell of rank k modulo N is written in the third memory cell of rank k+1 modulo N,
with:
  N being an integer greater than or equal to five.
  k an integer; and
  i an integer between 2 and N−3.

Another embodiment provides a method for implementing an incrementing operation of a monotonic counter, the value of which is represented by a number N of binary words stored in N memory cells of a non-volatile memory, each binary word having a size able to represent the maximum value of the said counter, wherein:

if i first memory cells of consecutive ranks between k modulo N and k+i modulo N, represent a value complementary to the null value, then the value of a second cell, of rank k+i+1 modulo N, is erased; and if i+1 third memory cells of consecutive ranks between k+1 modulo N and k+i+1 modulo N represent a value complementary to the null value, then the value incremented by twice the step of a fourth memory cell of rank k modulo N is written into the third memory cell of rank k+1 modulo N, with:

N being an integer greater than or equal to five.

k an integer; and i an integer between 2 and N−3.

According to one embodiment, the value complementary to the null value is the value taken by a memory cell after its erasure.

According to one embodiment, the memory cells of ranks strictly lower than k−1 modulo N and of ranks strictly higher than k+i+1 modulo N all represent any value different from the complementary value to the null value.

According to one embodiment, the monotonic counter represents the null value when a fifth memory cell representing the null value is followed directly by i sixth memory cells representing the value complementary to the null value.

According to one embodiment, i is two.

According to one embodiment, if the first two memory cells of consecutive ranks between k modulo N and k+i modulo N, represent the complementary value to the null value, a first initialization operation comprises the following steps:

writing the null value in the memory cell of rank k+2 modulo N.

erasing the memory cell of rank k+3 modulo N.

writing any value different from the complementary value to the null value, in the memory cell of rank k+1 modulo N; and erasing the value in the memory cell of rank k+4 modulo N.

According to one embodiment, during the step of writing the memory cell of rank k+1 modulo N, the any value is equal to the null value.

According to one embodiment, if the three third memory cells of consecutive ranks between k+1 modulo N and k+3 modulo N represent the value complementary to the null value, a second initialization operation comprises the following steps:

writing the null value in the memory cell of rank k+2 modulo N.

writing any value in the memory cell of rank k+1 modulo N; and erasing the value from the memory cell of rank k+4 modulo N.

According to one embodiment, during the step of writing the memory cell of rank k+1 modulo N, the any value is equal to the null value.

In an embodiment, a device comprises: a non-volatile memory, which, in operation, stores a number N of binary words in N memory cells of the non-volatile memory, the N binary words representing a value of a monotonic counter, each binary word having a size sufficient to store a maximum value of the monotonic counter; and control circuitry coupled to the memory, wherein the control circuitry, in operation, increments the value of the monotonic counter by a step size, the incrementing the value of the monotonic counter by the step size including: in response to i memory cells of the N memory cells of consecutive ranks between k modulo N and k+i modulo N each representing a value complementary to a null value, erasing a value of a memory cell of the N memory cells of rank k+i+1 modulo N; and in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein, N is an integer greater than or equal to five, k is an integer, and i is an integer between 2 and N−3. In an embodiment, the value complementary to the null value is a value of a memory cell of the N memory cells after the memory cell is erased. In an embodiment, the memory cells of ranks lower than k−1 modulo N and of ranks higher than k+i+1 modulo N all represent values different from the value complementary to the null value. In an embodiment, the monotonic counter represents the null value when a memory cell of the N memory cells representing the null value is followed in rank by i memory cells representing the value complementary to the null value. In an embodiment, i is two. In an embodiment, the control circuitry, in operation, performs an initialization operation, wherein in response to memory cells of the N memory cells of consecutive ranks between k modulo N and k+2 modulo N representing the value complementary to the null value, the initialization operation includes: writing the null value in the memory cell of rank k+2 modulo N; erasing the memory cell of rank k+3 modulo N; writing any value different from the value complementary to the null value, in the memory cell of rank k+1 modulo N; and erasing the memory cell of rank k+4 modulo N. In an embodiment, writing any value different from the value complementary to the null value, in the memory cell of rank k+1 modulo N, comprises writing the zero value in the memory cell of rank K+1 modulo N. In an embodiment, in response to memory cells of the N memory cells of consecutive ranks between k+1 modulo N and k+3 modulo N represent the value complementary to the null value, the initialization operation includes: writing the null value in the memory cell of rank k+2 modulo N; writing any value different from the value complementary to the null value in the memory cell of rank k+1 modulo N; and erasing the value of the memory cell of rank k+4 modulo N. In an embodiment, writing any value different from the value complementary to the null value, in the memory cell of rank k+1 modulo N, comprises writing the zero value in the memory cell of rank K+1 modulo N.

In an embodiment, a method, comprises: storing a number N of binary words in N memory cells of a non-volatile memory, the N binary words representing a value of a monotonic counter, each binary word having a size sufficient to store a maximum value of the monotonic counter; and incrementing the value of the monotonic counter by a step size. The incrementing the value of the monotonic counter by the step size includes: in response to i memory cells of the N memory cells of consecutive ranks between k modulo N and k+i modulo N each representing a value complementary to a null value, erasing a value of a memory cell of the N memory cells of rank k+i+1 modulo N; and in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein, N is an integer greater than or equal to five, k is an integer, and i is an integer between 2 and N−3. In an embodiment, the value complementary to the null value is a value of a memory cell of the N memory cells after the memory cell is erased. In an embodiment, the memory cells of ranks lower than k−1 modulo N and of ranks higher than k+i+1 modulo N all represent values different from the value complementary to the null value. In an embodiment, the monotonic counter represents the null value when a memory cell of the N memory cells representing the null value is followed in rank by i memory cells representing the value complementary to the null value. In an embodiment, i is two. In an embodiment, the method comprises performing an initialization operation, wherein in response to memory cells of the N memory cells of consecutive ranks between k modulo N and k+2 modulo N representing the value complementary to the null value, the initialization operation includes: writing the null value in the memory cell of rank k+2 modulo N; erasing the memory cell of rank k+3 modulo N; writing any value different from the value complementary to the null value, in the memory cell of rank k+1 modulo N; and erasing the memory cell of rank k+4 modulo N. In an embodiment, writing any value different from the value complementary to the null value, in the memory cell of rank k+1 modulo N, comprises writing the zero value in the memory cell of rank K+1 modulo N. In an embodiment, in response to memory cells of the N memory cells of consecutive ranks between k+1 modulo N and k+3 modulo N represent the value complementary to the null value, the initialization operation includes: writing the null value in the memory cell of rank k+2 modulo N; writing any value different from the value complementary to the null value in the memory cell of rank k+1 modulo N; and erasing the value of the memory cell of rank k+4 modulo N.

In an embodiment, a system comprises: a processor, which, in operation, processes data; and a monotonic counter coupled to the processor, wherein the monotonic counter, in operation: stores a number N of binary words in N memory cells of a non-volatile memory, the N binary words representing a value of a monotonic counter, each binary word having a size sufficient to store a maximum value of the monotonic counter; and responds to an indication to increment the value of the monotonic counter by a step size by: in response to i memory cells of the N memory cells of consecutive ranks between k modulo N and k+i modulo N each representing a value complementary to a null value, erasing a value of a memory cell of the N memory cells of rank k+i+1 modulo N; and in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein, N is an integer greater than or equal to five, k is an integer, and i is an integer between 2 and N−3. In an embodiment, the system comprises: functional circuitry coupled to the processor and to the monotonic counter, wherein the functional circuitry, in operation, retrieves the value stored in the monotonic counter. In an embodiment, the system comprises an integrated circuit including the processor and the monotonic counter.

In an embodiment, a non-transitory computer-readable medium's contents cause a monotonic counter to perform a method, the method comprising: storing a number N of binary words in N memory cells of a non-volatile memory, the N binary words representing a value of the monotonic counter, each binary word having a size sufficient to store a maximum value of the monotonic counter; and incrementing the value of the monotonic counter by a step size, the incrementing the value of the monotonic counter by the step size including: in response to i memory cells of the N memory cells of consecutive ranks between k modulo N and k+i modulo N each representing a value complementary to a null value, erasing a value of a memory cell of the N memory cells of rank k+i+1 modulo N; and in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein, N is an integer greater than or equal to five, k is an integer, and i is an integer between 2 and N−3. In an embodiment, the value complementary to the null value is a value of a memory cell of the N memory cells after the memory cell is erased. In an embodiment, i is two. In an embodiment, the method comprises performing an initialization operation. In an embodiment, the contents comprise instruction executed by processing circuitry of the monotonic counter.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof. The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
a non-volatile memory, which, in operation, stores a number N of binary words in N memory cells of the non-volatile memory, the N binary words representing a value of a monotonic counter, each binary word having a size sufficient to store a maximum value of the monotonic counter; and
control circuitry coupled to the memory, wherein the control circuitry, in operation, increments the value of the monotonic counter by a step size, the incrementing the value of the monotonic counter by the step size including:
in response to i memory cells of the N memory cells of consecutive ranks between k modulo N and k+i modulo N each representing a value complementary to a null value, erasing a value of a memory cell of the N memory cells of rank k+i+1 modulo N; and
in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein,
N is an integer greater than or equal to five,
k is an integer, and
i is an integer between 2 and N−3.

2. The device of claim 1, wherein the value complementary to the null value is a value of a memory cell of the N memory cells after the memory cell is erased.

3. The device of claim 1, wherein the memory cells of ranks lower than k−1 modulo N and of ranks higher than k+i+1 modulo N all represent values different from the value complementary to the null value.

4. The device of claim 1, wherein the monotonic counter represents the null value when a memory cell of the N memory cells representing the null value is followed in rank by i memory cells representing the value complementary to the null value.

5. The device of claim 1, wherein i is two.

6. The device of claim 5, wherein the control circuitry, in operation, performs an initialization operation, wherein in response to memory cells of the N memory cells of consecutive ranks between k modulo N and k+2 modulo N representing the value complementary to the null value, the initialization operation includes:
writing the null value in the memory cell of rank k+2 modulo N;
erasing the memory cell of rank k+3 modulo N;
writing any value different from the value complementary to the null value, in the memory cell of rank k+1 modulo N; and
erasing the memory cell of rank k+4 modulo N.

7. The device of claim 6, herein the writing any value different from the value complementary to the null value, in the memory cell of rank k+1 modulo N, comprises writing the zero value in the memory cell of rank K+1 modulo N.

8. The device of claim 6, wherein in response to memory cells of the N memory cells of consecutive ranks between k+1 modulo N and k+3 modulo N represent the value complementary to the null value, the initialization operation includes:
writing the null value in the memory cell of rank k+2 modulo N;
writing any value different from the value complementary to the null value in the memory cell of rank k+1 modulo N; and
erasing the value of the memory cell of rank k+4 modulo N.

9. The device according to claim 8, wherein the writing any value different from the value complementary to the null value, in the memory cell of rank k+1 modulo N, comprises writing the zero value in the memory cell of rank K+1 modulo N.

10. A method, comprising:
storing a number N of binary words in N memory cells of a non-volatile memory, the N binary words representing a value of a monotonic counter, each binary word having a size sufficient to store a maximum value of the monotonic counter; and
incrementing the value of the monotonic counter by a step size, the incrementing the value of the monotonic counter by the step size including:
in response to i memory cells of the N memory cells of consecutive ranks between k modulo N and k+i modulo N each representing a value complementary to a null value, erasing a value of a memory cell of the N memory cells of rank k+i+1 modulo N; and
in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein,
N is an integer greater than or equal to five,
k is an integer, and
i is an integer between 2 and N−3.

11. The method of claim 10, wherein the value complementary to the null value is a value of a memory cell of the N memory cells after the memory cell is erased.

12. The method of claim 10, wherein the memory cells of ranks lower than k−1 modulo N and of ranks higher than k+i+1 modulo N all represent values different from the value complementary to the null value.

13. The method of claim 10, wherein the monotonic counter represents the null value when a memory cell of the N memory cells representing the null value is followed in rank by i memory cells representing the value complementary to the null value.

14. The method of claim 10, wherein i is two.

15. The method of claim 14, comprising performing an initialization operation, wherein in response to memory cells of the N memory cells of consecutive ranks between k modulo N and k+2 modulo N representing the value complementary to the null value, the initialization operation includes:
writing the null value in the memory cell of rank k+2 modulo N;
erasing the memory cell of rank k+3 modulo N;
writing any value different from the value complementary to the null value, in the memory cell of rank k+1 modulo N; and
erasing the memory cell of rank k+4 modulo N.

16. The method of claim 15, wherein the writing any value different from the value complementary to the null value, in the memory cell of rank k+1 modulo N, comprises writing the zero value in the memory cell of rank K+1 modulo N.

17. The method of claim 15, wherein in response to memory cells of the N memory cells of consecutive ranks between k+1 modulo N and k+3 modulo N represent the value complementary to the null value, the initialization operation includes:
   writing the null value in the memory cell of rank k+2 modulo N;
   writing any value different from the value complementary to the null value in the memory cell of rank k+1 modulo N; and
   erasing the value of the memory cell of rank k+4 modulo N.

18. A system, comprising:
   a processor, which, in operation, processes data; and
   a monotonic counter coupled to the processor, wherein the monotonic counter, in operation:
      stores a number N of binary words in N memory cells of a non-volatile memory, the N binary words representing a value of a monotonic counter, each binary word having a size sufficient to store a maximum value of the monotonic counter; and
      responds to an indication to increment the value of the monotonic counter by a step size by:
         in response to i memory cells of the N memory cells of consecutive ranks between k modulo N and k+i modulo N each representing a value complementary to a null value, erasing a value of a memory cell of the N memory cells of rank k+i+1 modulo N; and
         in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein,
   N is an integer greater than or equal to five,
   k is an integer, and
   i is an integer between 2 and N−3.

19. The system of claim 18, comprising:
   functional circuitry coupled to the processor and to the monotonic counter, wherein the functional circuitry, in operation, retrieves the value stored in the monotonic counter.

20. The system of claim 18, comprising an integrated circuit including the processor and the monotonic counter.

21. A non-transitory computer-readable medium having contents which cause a monotonic counter to perform a method, the method comprising:
   storing a number N of binary words in N memory cells of a non-volatile memory, the N binary words representing a value of the monotonic counter, each binary word having a size sufficient to store a maximum value of the monotonic counter; and
   incrementing the value of the monotonic counter by a step size, the incrementing the value of the monotonic counter by the step size including:
      in response to i memory cells of the N memory cells of consecutive ranks between k modulo N and k+i modulo N each representing a value complementary to a null value, erasing a value of a memory cell of the N memory cells of rank k+i+1 modulo N; and
      in response to i+1 memory cells of the N memory cells of consecutive ranks between k+1 modulo N and k+i+1 modulo N each representing the value complementary to the null value, incrementing a value of a memory cell of the N memory cells of rank k modulo N by two step sizes and storing a result of the incrementing of the value of the memory cell of rank k modulo N by two step sizes in a memory cell of the N memory cells of rank k+1 modulo N, wherein,
   N is an integer greater than or equal to five,
   k is an integer, and
   i is an integer between 2 and N−3.

22. The non-transitory computer-readable medium of claim 21, wherein the value complementary to the null value is a value of a memory cell of the N memory cells after the memory cell is erased.

23. The non-transitory computer-readable medium of claim 21, wherein i is two.

24. The non-transitory computer-readable medium of claim 21, the method comprising performing an initialization operation.

25. The non-transitory computer-readable medium of claim 21, wherein the contents comprise instruction executed by processing circuitry of the monotonic counter.

* * * * *

UNITED STATES PATENT AND TRADEMARK OFFICE
CERTIFICATE OF CORRECTION

PATENT NO. : 11,715,506 B2
APPLICATION NO. : 17/691870
DATED : August 1, 2023
INVENTOR(S) : Michael Peeters et al.

It is certified that error appears in the above-identified patent and that said Letters Patent is hereby corrected as shown below:

In the Claims

Column 19, Claim 7, Line 59:
"claim 6, herein the writing" should read: --claim 6, wherein the writing--.

Column 19, Claim 7, Line 62:
"K+1" should read: --k+1--.

Column 20, Claim 9, Line 11:
"K+1" should read: --k+1--.

Column 21, Claim 16, Line 2:
"K+1" should read: --k+1--.

Signed and Sealed this
Twelfth Day of September, 2023

Katherine Kelly Vidal
*Director of the United States Patent and Trademark Office*